United States Patent [19]
Elliott

[11] 4,339,637
[45] Jul. 13, 1982

[54] ELECTRICAL CONTAINER

[76] Inventor: William H. Elliott, 134 Howard Rd., Rochester, N.Y. 14606

[21] Appl. No.: 227,622

[22] Filed: Jan. 23, 1981

Related U.S. Application Data

[63] Continuation-in-part of Ser. No. 12,578, Feb. 15, 1979, abandoned.

[51] Int. Cl.³ .................... H01H 9/00; H01R 13/42
[52] U.S. Cl. .................... 200/51.09; 339/108 TP; 339/258 R
[58] Field of Search ............ 339/74 R, 75 R, 108 TP, 339/252 R, 256 R, 258 R, 258 RR; 200/51 R, 51.09, 51.1

[56] References Cited

U.S. PATENT DOCUMENTS

| | | | |
|---|---|---|---|
| 1,816,846 | 8/1931 | Harvey | 200/51.09 |
| 2,204,295 | 6/1940 | Brockman | 200/51.09 |
| 2,515,004 | 7/1950 | Haupt | 339/108 TP |
| 2,574,043 | 11/1951 | Lannou | 339/108 TP |
| 2,714,196 | 7/1955 | Melehan | 339/108 TP |
| 3,182,257 | 5/1965 | Linkowski | 339/108 TP |
| 3,201,746 | 8/1965 | Askew | 339/108 TP |

FOREIGN PATENT DOCUMENTS 1252294 10/1967 Fed. Rep. of Germany ...... 339/108 TP Primary Examiner—John W. Shepperd
Attorney, Agent, or Firm—Real J. Grandmaison

[57] ABSTRACT

An electrical container for completing an electric circuit comprising an electrically insulating housing, a collapsible gripper mechanism located inside the housing for fastening to an electrical wire, spring loaded pusher means protruding from one end of the housing which is adapted to move the gripper mechanism from inside the housing whereby the gripper opens and then closes upon the electrical wire when pressure is released from the pusher means and the gripper returns inside the housing. A conductor bar is located between the pusher means and a spring mechanism for return of the gripper inside the housing. The conductor bar is adapted to conduct an electric current from an electrical wire to a contact rod inside the electrical container only when the conductor bar is in contact with the contact rod.

7 Claims, 5 Drawing Figures

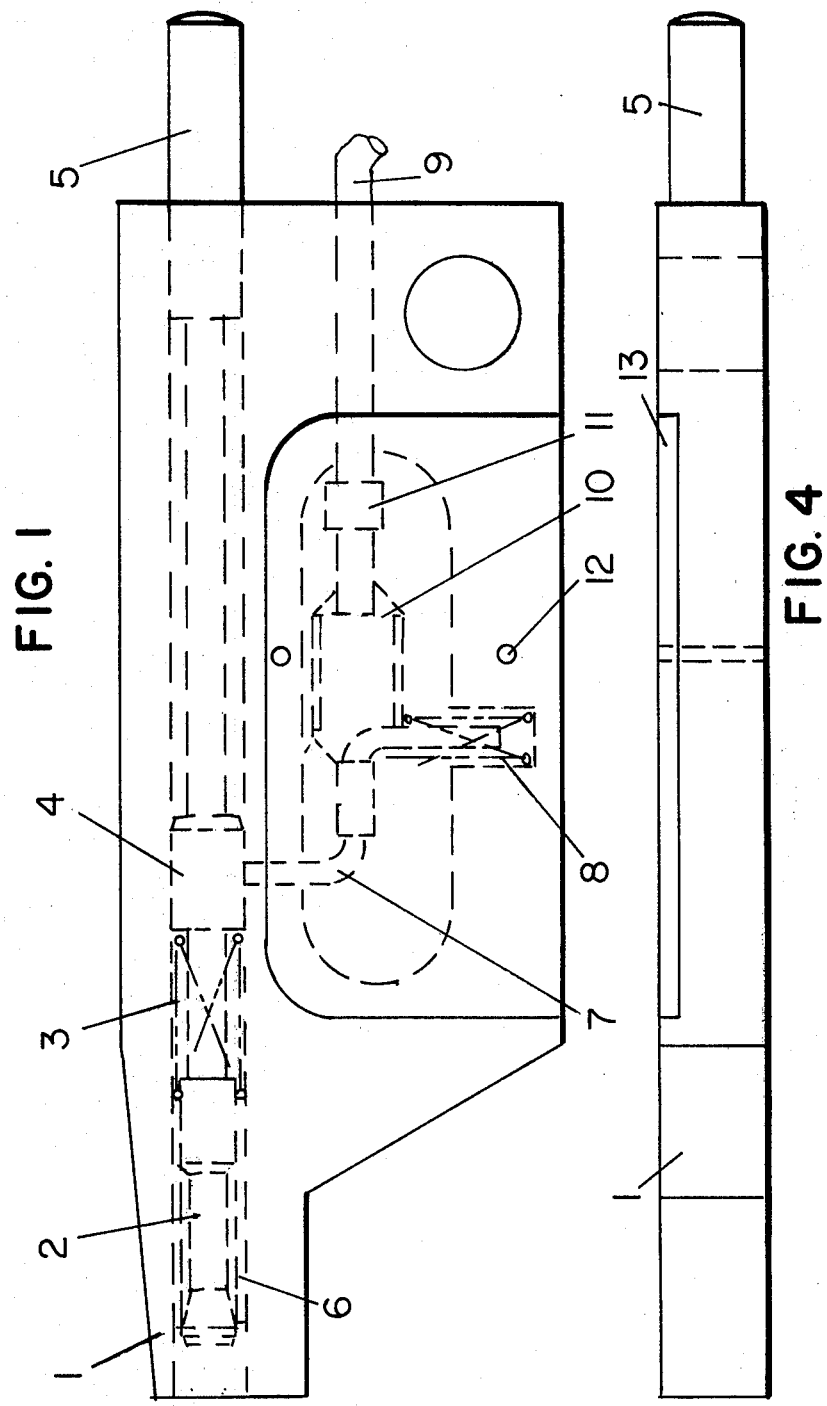

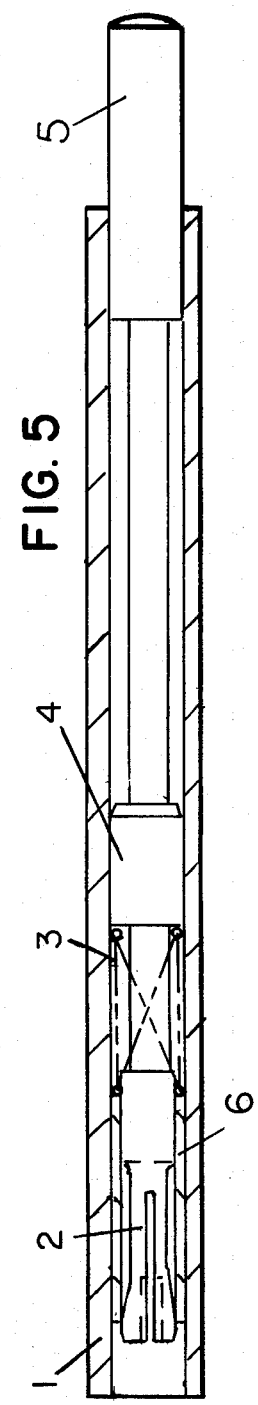

4,339,637

ELECTRICAL CONTAINER

This application is a continuation-in-part application of U.S. Ser. No. 012,578, filed on Feb. 15, 1979, now abandoned.

This invention relates to an electrical container for completeting an electric circuit, and more particularly, to an electrical container wherein the operator of the container is protected from receiving an electric charge or arc when it is connected to live wires or equipment.

PRIOR ART STATEMENT

Various devices are known for testing electrical circuit and for making electrical connections. For example, it is disclosed in U.S. Pat. No. 1,816,846 issued to W. H. Harvey that a tool for making test connections to windings of electromagnets and the like may be provided without danger of closing circuits by accidental contact of the tool with metal parts. The tool comprises a mounting block, a member arranged for movement within the block, means for engagement with relay terminals, a spring tensioned by the movement of the block with respect to said member for holding the tool in position of the relay, and switch means actuated by movement of the member. The switching means relies upon a rod provided with a pin as a contact element which engages a compression spring for affecting contact with another contact element in the form of a leaf spring. Engagement of the pin with the leaf spring establishes a circuit connection from the terminal to be tested to the cord terminal of the testing unit. However, continuous tension by the operator must be exerted on the device in order to maintain electrical contact.

Another tool for testing electric circuits is disclosed by G. Melahan in U.S. Pat. No. 2,174,196. This tool comprises a hollow cylindrical casing having finger grip means projecting outwardly its upper end and an axial bore extending therethrough. The bore is enlarged at its upper end and has a transverse slot connecting with its lower end. A metal rod is mounted slidably within said bore and has a hook on its lower end. A spring is mounted within the casing for urging the rod upwardly whereby its upper end projects above the casing and its lower hooked end is withdrawn within the slot. Means are provided for limiting the movement of the rod within the bore. The hook has barbs which penetrate through the insulation on the wire of the circuit to be tested and holds it in position while the operator takes his reading.

A further device for performing electrical tests and measurements is disclosed in German Patent No. 1,252,294 issued to R. Hirschmann. The measuring clamp therein comprises two automatically expanding spring clamping jaws attached to one end of a connecting rod which can be moved in a long, flexible tube. The jaws can be moved out of the tube by means of a push-button provided at the other end of the connecting rod. After release of the push-button, the clamping jaws are drawn back into the tube by means of a pressure spring and thereby clamp onto a wire making an electric circuit. As with devices of this type, when the device is attached to an electrical carrier, a live connection is made which may result in an electrical arc or shock to the operator and cause serious injury or damage.

Therefore, it is an object of this invention to provide an electrical container which overcomes the above-noted disadvantages.

It is another object of this invention to provide an electrical container which permits a live electrical connection to be made only when live electrical wires are safely within the chamber of said electrical container.

It is a further object of this invention to provide an electrical container which does not require constant manual pressure thereon to maintain an electrical connection therewith.

It is still a further object of this invention to provide an electrical container whereby a live electrical wire may be connected thereto and prevent electric current from flowing into or through the electrical container.

It is still a further object of this invention to provide an electrical container wherein the operator thereof is protected from receiving an electric charge or arc when attaching it to live wires or equipment.

The foregoing objects, and others, are obtained, generally speaking, by providing an electrical container for completing an electric circuit comprising an electrically insulating housing, a collapsible gripper mechanism located inside the housing for fastening to an electrical wire, spring loaded pusher means protruding from one end of the housing which is adapted to move the gripper mechanism from inside the housing whereby the gripper opens and then closes upon the electrical wire when pressure is released from the pusher means and the gripper returns inside the housing. A conductor bar is located between the pusher means and a spring mechanism for return of the gripper inside the housing. The conductor bar is adapted to conduct an electric current from an electrical wire to a contact rod inside the electrical container only when the conductor bar is in contact with the contact rod. The contact rod is in contact with the conductor bar only when the gripper mechanism is retracted within the housing of the electrical container. The electrical container is connected through the contact rod to an electric power source to complete an electrical circuit.

The features of the present invention will become more apparent as the following description proceeds and upon reference to the drawings in which:

FIG. 1 is a planar side view depicting an eletrical container incorporating the elements of the present invention therein;

FIG. 2 is a frontal end view depicting the retracted gripper mechanism of the electrical container of this invention;

FIG. 3 is a back end view depicting the pusher means in its protracted position, and, also shows an opening for an electrical wire connection;

FIG. 4 is a planar side view illustrating a cover door 13 for the electrical container; and FIG. 5 is another planar side view depicting another embodiment of the collapsible gripper mechanism of this invention.

For a general understanding of the features of the present invention, reference is now made to the drawings. In the drawings, like reference numerals have been used throughout to designate identical elements. FIG. 1 schematically depicts the various components of an illustrative electrical container in accordance with this invention.

Shown in FIG. 1 is general housing 1 comprising any suitable electrically insulating material such as a plastic or resin material to house the various components of the electrical container. Located inside housing 1 is collapsible gripper mechanism 2 for fastening to an electrical wire. Gripper mechanism 2 is attached to spring 3 which in turn is attached to conductor bar 4 fixedly mounted to the end of pusher means 5. Gripper mechanism 2, spring 3, conductor bar 4 and pusher means 5 are all slidably mounted in a cylindrical hollow or groove 6 inside housing 1. As seen in FIG. 1, pusher means 5 has one end protruding from housing 1 and gripper mechanism 2 is entirely inside housing 1. In operation, when pressure is applied to pusher means 5, conductor bar 4 is moved into spring 3 causing spring 3 to partially collapse but also to move gripper mechanism 2 outside of housing 1. As gripper mechanism 2 moves outside of housing 1, gripper mechanism 2 opens and is in a position to have an electrical wire inserted between its opening. When pressure is released from pusher means 5, spring 3 causes conductor bar 4 to move back to its original position and gripper mechanism 2 moves back inside housing 1. During this operation, as gripper mechanism 2 moves back inside housing 1, gripper mechanism 2 is forced to close upon and grip the electrical wire inserted between its opening. Gripper mechanism 2 closes upon the electrical wire because as it returns inside housing 1, it is retracted by the confining walls of cylindrical hollow or groove 6 inside housing 1. Obviously, gripper mechanism 2 permits securing to it wires of various sizes.

When no pressure is applied to pusher means 5, conductor bar 4 is in contact with contact rod 7 to form a closed electrical circuit. In operation, when pressure is applied to pusher means 5, conductor bar 4 is moved laterally inside cylindrical groove 6 and out of contact with contact rod 7. When pressure is released from pusher means 5, spring 3 returns conductor bar 4 to its normal position and in contact with contact rod 7. Thus, it is seen that when gripper mechanism 2 has gripped a live electrical wire and has returned inside housing 1, conductor bar 4 is in contact with contact rod 7 to form an electrical circuit. To ensure contact of contact rod 7 with conductor bar 4, contact rod 7 is spring loaded with spring 8. To complete an electrical circuit contact rod 7 is electrically connected to electric wire 9 by metal tab 10 secured by metal paw 11. After assembly, contact rod 7, spring 8, electric wires 9, tab 10 and paw 11 are suitably covered by insulating housing material in the form of a removable cover secured in place per screws 12. In like fashion, gripper mechanism 2, spring 3, conductor bar 4 and pusher mechanism 5 may be suitably protected by insulating housing material in the form of cover door 13 as depicted in FIG. 4.

From the foregoing description of the elements of the electrical container of this invention, it is readily understood that applying pressure to pusher means 5 will push gripper mechanism 2 through cylindrical hollow 6 and outside of housing 1 causing collapsible gripper mechanism 2 to open permitting an electrical wire to be inserted therein. It will also be understood that at this time, conductor bar 4 is out of contact with contact rod 7 and therefore the electrical connection between conductor bar 4 and contact rod 7 is open or broken. Thus, no electric current can flow through the electrical container when gripper mechanism 2 is outside of housing 1. By releasing pressure from pusher means 5, gripper mechanism 2 with the attached electrical wire is pulled back into housing 1 by spring 3 and conductor bar 4 is pushed into contact position with contact rod 7 to close or complete an electrical circuit. Electric wire 9 is connected to a conventional electric power supply (not shown). Thus, the electrical container may be hooked-up with or connected to any wire or wires or electrical apparatus (not shown), for any suitable purpose such as for forming an electrical circuit or for testing such wire (s) or apparatus.

It will be appreciated that the user or operator of the electrical container of this invention is protected from receiving an electric charge or arc when attaching an electric source to it and when detaching from it. Likewise, when in use, that is, when the electrical container is attached to an electric wire and an electric circuit is formed, there is no danger to the user or operator because the electric wire is contained within the insulated housing of the container and cannot contact the user or operator.

As earlier indicated, housing 1 is preferably constructed from an electrically insulating material, and preferably has a head section protruding therefrom like a gun barrel. Gripper mechanism 2 is located inside this head section in cylindrical hollow 6 which forms a cave-like den for gripper mechanism 2 when it is retracted inside housing 1. Cylindrical hollow 6 is so constructed that as gripper mechanism 2 returns inside housing 1, collapsible gripper mechanism 2 is forced to contract by the walls of cylindrical hollow 6 and grip tightly the electric wire upon which it has collapsed. In like fashion, spring 3, conductor bar 4, and pusher means 5 are all contained inside housing 1 in a cylindrical hollow or recess of housing 1, it being understood that pusher means 5 will protrude from housing 1 to enable application of pressure thereto. It will also be understood that the protruding head of pusher means 5 is constructed of any suitable electrically insulating material to protect the user from electrical contact. In similar fashion, contact rod 7, spring 8, and electric wire 9 with tab 10 and paw 11 are contained inside housing 1 in suitable recesses of housing 1. Finally, a suitable cover of insulating housing material adapted to be screwed is preferably placed over the aforementioned elements for protection and to enable examination or repair of the elements of the electrical container.

It is also to be understood that cylindrical hollow 6 may comprise a durable hollow metal cylinder for easier movement of gripper mechanism 2 and also serve as a stop therefor when gripper mechanism 2 is retracted inside housing 1. It will be appreciated that when gripper mechanism 2 grips a stripped or bare electric wire and retracts with it inside housing 1 that the operator of the electrical container is protected from harm or injury since only covered or insulated electric wire is now outside of housing 1. The bare or uninsulated portion of electric wire is pulled safely inside of housing 1 when gripper mechanism 2 is retracted by release of pressure on pusher means 5. When pressure is applied to pusher means 5, conductor bar 4 is pushed out of contact with contact rod 7, and when pressure is released from pusher means 5, conductor bar 4 is pushed back by spring 3 into contact with contact rod 7. Thus, no electric current can go through conductor bar 4 when pressure is exerted on pusher means 5 to cause gripper mechanism 2 to open for insertion of an electric wire because it is not in electrical contact with contact rod 7 which is connected to an external electric power supply.

Gripper mechanism 2 may be constructed of any suitable electrically conductive material. Typical electrically conductive materials include metals such as iron and steel. Preferably, gripper mechanism 2 is made from a metal for durability. In addition, gripper mechanism 2 is preferably constructed as a vise mechanism, it may appear as an opening and closing jaw structure, or it may be in the form of thin walls having serrations part way down the walls from its head. In any event, gripper mechanism 2 is so constructed that when it is held inside cylindrical hollow 6 it will be retracted, and when it is pushed outside of housing 1 it will open for insertion of an electric wire therein. For greater durability, the metal used in constructing gripper mechanism 2 should be a tempered metal.

Conductor bar 4 and contact rod 7 may be constructed of any suitable electrically conductive material. Typical electrically conductive materials include metals such as iron, steel, aluminum, and copper. Preferably, conductor bar 4 and contact rod 7 are constructed from copper because such is a good conductor and provides manufacturing advantages. Conductor bar 4 and contact rod 7 may suitably be formed in the shape of a rod or a piston although other shapes are suitable.

In accordance with this invention, when gripper mechanism 2 has secured a live electric wire and retracted inside housing 1, the electrical container is now a self-contained unit and the user or operator can walk away from it. The electrical container can now operate by itself with electrical power flowing through it serving as a temporary or permanent electrical hook-up or connection. If the electric wire moves free from gripper mechanism 2, it is merely disconnected and the circuit is broken providing protection to the operator during both connection and disconnection with a live electric wire. This is a major advantage compared with devices of the prior art which provide little or no protection to the user since they generally provide protection only at the point away from the electrical connection. That is, with prior devices, the area where the electrical connection is made to the device is open so that the user will be injured if he contacts this area of the device. In addition, prior devices are dangerous to the user if there is a malfunction of the device, or if it is accidentally touched, moved, or left on in an operating condition. By comparison, the electrical container of this invention provides protection to the user both at the front and rear areas thereof.

Although specific materials and embodiments are set forth in the foregoing disclosure, these are merely intended as illustrations of the present invention. Various other suitable materials and components may be substituted therefor with similar results. Other modifications will occur to those skilled in the art upon a reading of the present disclosure. These are intended to be included within the scope of this invention.

What is claimed is:

1. An electrical container for completing an electric circuit comprising:
(a) an electrically insulating housing;
(b) an electrically conductive, collapsible gripper mechanism located inside said housing for fastening to an electrically conductive wire;
(c) a spring located inside said housing wherein said spring is attached to said gripper mechanism and is adapted to return said gripper mechanism inside said housing;
(d) an electrically conductive conductor bar located inside said housing wherein said conductor bar is attached to said spring and is adapted to conduct an electric current from said electrically conductive wire;
(e) an electrically conductive contact rod in contact with said conductor bar only when said gripper mechanism is retracted within said housing;
(f) an electrically insulating pusher means wherein one end of said pusher means protrudes from said housing and wherein the other end of said pusher means is located inside said housing and is attached to said conductor bar, wherein upon application of pressure to the end of said pusher means protruding from said housing said pusher means slidably moves said conductor bar out of contact with said contact rod, causes said spring to partially compress, and said gripper mechanism to protrude from said housing and to open, and upon release of pressure from said pusher means said gripper mechanism closes and retracts within said housing, said spring decompresses, and said conductor bar moves into contact with said contact rod; and
(g) an electric wire connected to said contact rod.

2. An electrical container as in claim 1 wherein said contact rod is connected to said electric wire by a metal tab secured by a metal paw.

3. An electrical container as in claim 1 wherein said gripper mechanism, said spring, said conductor bar, and said pusher means are slidably mounted in a cylindrical hollow inside said housing.

4. An electrical container as in claim 1 wherein said gripper mechanism, said spring, said conductor bar, and said contact rod are made of metal.

5. An electrical container as in claim 1 wherein said conductor bar and said contact rod are made from copper.

6. An electrical container as in claim 1 wherein said gripper mechanism is provided with a cylindrical stop means to control the return movement of said gripper mechanism inside said housing when pressure is released from said pusher means.

7. An electrical container as in claim 1 wherein said gripper mechanism comprises thin walls which are split part way down from the head of said gripper mechanism so that said gripper mechanism is collapsible.

* * * * *